(12) United States Patent
Heid

(10) Patent No.: US 6,291,998 B1
(45) Date of Patent: Sep. 18, 2001

(54) BASIC FIELD MAGNET FOR AN MRI APPARATUS WITH A DISPLACEABLE HOMOGENEITY VOLUME

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/265,820

(22) Filed: Mar. 10, 1999

(30) Foreign Application Priority Data

Mar. 31, 1998 (DE) .......................................... 298 05 903 U

(51) Int. Cl.⁷ .............................. A61B 5/055; G01V 3/00
(52) U.S. Cl. .......................... 324/320; 324/319; 324/313
(58) Field of Search ..................... 324/300–322

(56) References Cited

U.S. PATENT DOCUMENTS

| | | | |
|---|---|---|---|
| 4,015,196 | * 3/1977 | Moore et al. | 324/309 |
| 4,240,439 | 12/1980 | Abe et al. | 600/412 |
| 4,737,754 | 4/1988 | Goldie | 335/299 |
| 4,985,679 | 1/1991 | McDougall | 324/318 |
| 5,121,060 | * 6/1992 | Doddrell et al. | 324/320 |
| 5,365,172 | * 11/1994 | Hrovat et al. | 324/309 |
| 5,646,532 | * 7/1997 | Knuttel et al. | 324/321 |
| 5,969,525 | * 10/1999 | Van Driel et al. | 324/318 |

FOREIGN PATENT DOCUMENTS 0 710 851    5/1996 (EP) .

OTHER PUBLICATIONS

"Dynamic Shimming for Multi–Slice Magnetic Resonance Imaging," Morrell et al., MRM vol. 38 (1977), pp. 477, 483.

* cited by examiner

Primary Examiner—Christine Oda
Assistant Examiner—Tiffany A. Fetzner
(74) Attorney, Agent, or Firm—Schiff Hardin & Wait

(57) ABSTRACT

A magnet assembly for a magnetic resonance imaging apparatus, has a magnet with a patient receptacle therein, the magnet producing a basic magnetic field having a homogeneity volume within the patient receptacle. Auxiliary components in the form of coils or ferromagnetic elements are disposed relative to the magnet to selectively spatially displace the homogeneity volume, either by selectively activating current flowing through the respective coils, or by selective positioning of the ferromagnetic elements.

11 Claims, 1 Drawing Sheet

BASIC FIELD MAGNET FOR AN MRI APPARATUS WITH A DISPLACEABLE HOMOGENEITY VOLUME

BACKGROUND OF THE INVENTION

1. Field of the Invention

The present invention relates to a magnet assembly for generating the basic magnetic field in a magnetic resonance imaging (MRI) device.

2. Description of the Prior Art

A magnet is a component of a magnetic field generation unit of an MRI device. The magnet in such an assembly has a patient tube in which a patient lies during his/her examination. The magnetic field generation unit generates a substantially homogenous and temporally constant (main) magnetic field (also called a basic magnetic field or $B_0$ field) in an examination volume (imaging volume) situated inside the patient tube. Because of the necessary homogeneity of the examination volume, this is also called a homogeneity volume.

The minimum required extent of the generally spherical homogeneity volume is determined by the fact that signal pickups must be possible at spatially varied positions of the patient. Thus, for example, head surveys are performed centered with respect to the magnetic longitudinal axis, while heart imaging occurs outside the magnetic longitudinal axis. The required minimum extent of the homogeneity volume thus must be relatively large, although the examined organs or body regions themselves would require only a small homogeneity volume.

The extent of the homogeneity volume is essentially determined by the length of the magnet. The size (length and diameter) of the magnet determines the cost of the magnet, with a larger size naturally resulting in a correspondingly higher cost due to the basis of the required basic homogeneity. Furthermore, in long patient tubes, which are at least as long as the patient himself or herself, the patient may experience anxiety during the examination.

SUMMARY OF THE INVENTION

An object of the present invention is to provide a magnet assembly which enables the construction of a cost-effective and patient-friendly MRI device.

This object is inventively achieved in a magnet assembly having a magnet according with a patient receptacle inside of which the homogeneity volume is situated. This homogeneity volume is inventively displaceable in space by an auxiliary means. In the inventive magnet according to the invention, a $\Delta B_0$ field is easily impressed on the $B_0$ field (main magnetic field), thus making it possible to achieve a spatial displacement, and thus more than one single positioning, of the homogeneity volume.

The inventive solution is suitable for a number of MRI devices. For example, the magnet can be constructed as a cylindrical magnet (solenoid) or as a horseshoe magnet (C-arm MRI device). Given cylindrical magnets, the patient receptacle is constructed as a patient tube.

In the inventive magnet, the homogeneity volume is adapted exclusively to the size of the examined organs or body regions, such as the heart or head. Thus, the inventive magnet has a considerably smaller homogeneity volume than conventional MRI magnets, since the varying position of the examined organs or body regions no longer needs to be considered in the dimensioning of the homogeneity volume. In the inventive magnet, the varying position of the examined organs or body parts is taken into account by the displaceability of the homogeneity volume. Accordingly, the smaller homogeneity volume compared to known magnets is inexpensive to produce, since the inventive magnet is constructed smaller, particularly shorter. The shorter length of the inventive magnet compared to conventional magnets also leads to a correspondingly shorter patient tube in cylindrical magnets, resulting in a greater comfort for the patient and easier access.

Any field non-homogeneities which may arise in a displacement of the homogeneity field can be arithmetically determined and compensated by the usual measures.

In the context of the invention, the homogeneity volume can be displaced in all directions. In general, however, a displaceability along the x-axis should be sufficient. A displaceability along the y-axis (perpendicular to the z-axis and to the x-axis) is only necessary given a very small homogeneity volume. A displaceability of the homogeneity volume in the direction of the z-axis (i.e. in the direction of the longitudinal axis of the magnet) is usually not necessary, since, in this case, a displacement of the patient bed in the patient tube is simpler, circumstances permitting.

The auxiliary means for the spatial displacement of the homogeneity volume can be formed by displacement coils or ferromagnetic displacement elements. A combination of displacement coils and displacement elements also can serve for the spatial displacement of the homogeneity volume.

DESCRIPTION OF THE PREFERRED EMBODIMENTS

Figure 1:
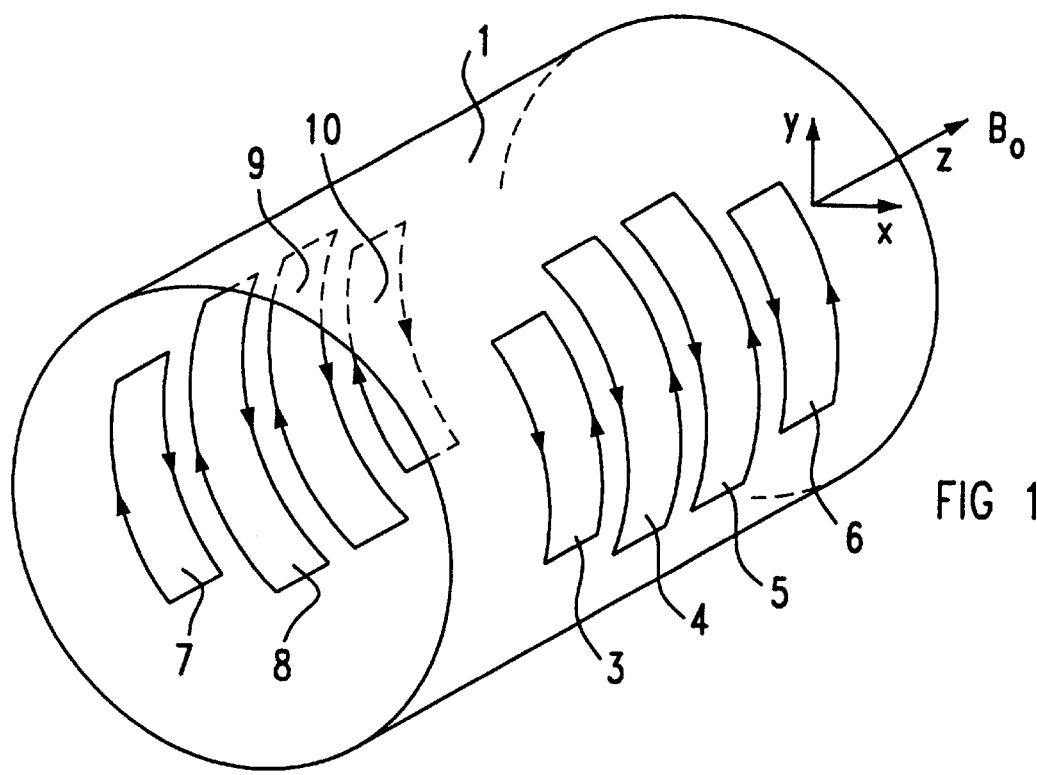
FIG. 1 is a schematic perspective view of an inventive magnet assembly having a magnet with auxiliary means formed by a number of displacement coils.
Figure 2:
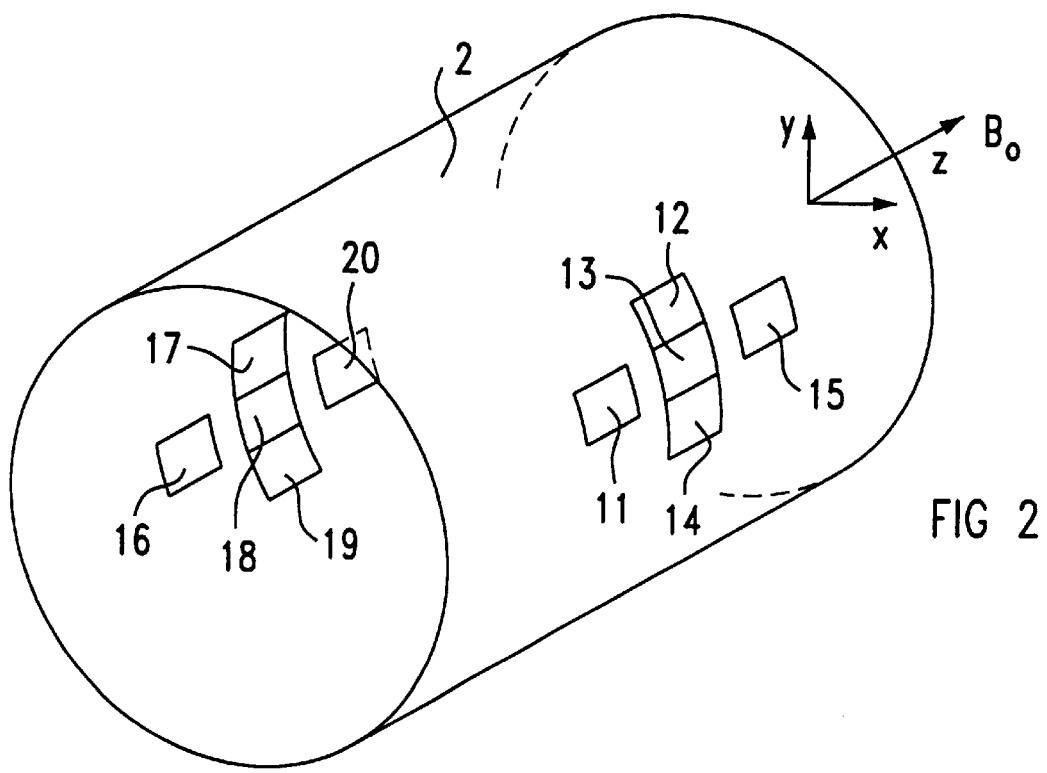
FIG. 2 is a schematic perspective view of an inventive magnet assembly having a magnet with auxiliary means formed by a number of ferromagnetic displacement elements.

In FIGS. 1 and 2, a magnet which has a patient tube and which is a component of a magnetic field generator in an MRI device is referenced 1 or 2, respectively. The magnets 1 and 2 are depicted only as tubes in FIGS. 1 and 2. For clarity, the high-frequency coils, the three gradient coils and the patient bed are not depicted, since these items are well-known to those of skill in this field. The magnetic field generator a generates a substantially homogenous and temporally constant $B_0$ field (also called the basic magnetic field or the main magnetic field) in a homogeneity volume (also called an examination volume or an imaging volume) situated within the patient tube. By definition, the z-axis of a Cartesian coordinate system lies in the direction of the $B_0$ field. The plane which is perpendicular to the field lines is then the xy plane, the x axis extending horizontally and the y axis extending vertically.

The magnet 1 depicted in FIG. 1 includes auxiliary means formed by a number of displacement coils 3 to 10. In the exemplary embodiment, four displacement coils 3 to 6 and 7 to 10, respectively, are arranged oppositely and at either side of the $B_0$ field. To displace the homogeneity volume in the horizontal direction and transversely to the $B_0$ field (in the direction of the x-axis), the displacement coils 3 to 10 must be correspondingly charged with current. Current flows in a same, first direction in each of the displacement coils 3 to 6 and current flows in a same, second direction in each of the displacement coils 7 to 10. The first and second current flow direction are opposite each other. Thus the respectively opposed displacement coils (the displacement coils 3 and 7, and 4 and 8, and 5 and 9, and 6 and 10) are respectively charged with current such that an opposed current flow arises. The current flow in the neighboring displacement coils 3 to 6 thus proceeds counterclockwise, while the current flow in the neighboring displacement coils 7 to 10 proceeds clockwise. The current flow directions are indicated with arrows in FIG. 1.

In the embodiment of the magnet 2 depicted in FIG. 2, the inventive displacement of the homogeneity volume in the horizontal direction and transversely to the $B_0$ field is achieved by auxiliary means formed by a number of ferromagnetic displacement elements 11 to 20, which are preferably constructed as iron sheets.

In a head survey, which occurs centered relative to the magnetic longitudinal axis (z-axis) and thus does not require any influencing of the $B_0$ field, the displacement coils 3 to 10 in the magnet 1 are inactive (FIG. 1), or the ferromagnetic displacement elements 11 to 20 in the magnet 2 are removed (FIG. 2). When a heart imaging is desired, which occurs outside the magnetic longitudinal axis, then, as described above, the displacement coils 3 to 10 are activated, or respectively, the relevant ferromagnetic displacement elements 11 to 15 or 16 to 20 are positioned at or in the magnet 2. For the displacement elements 11 to 20, retainers (not depicted) can be provided at the outer jacket surface of the magnet 2 for this purpose, the displacement elements 11 to 20 being insertable in those retainers.

In both the embodiment according to FIG. 1 and the embodiment according to FIG. 2, a $\Delta B_0$ field is impressed on the $B_0$ field (main magnetic field), thereby allowing a spatial displacement, and thus more than one positioning, of the homogeneity volume.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnet assembly for a magnetic resonance imaging apparatus, said magnet assembly comprising:
   a magnet having a patient receptacle therein, said magnet producing a basic magnetic field having a homogeneity volume at a defined volume location; and
   auxiliary means disposed relative to said magnet for selectively, temporarily spatially displacing substantially an entirety of said homogeneity volume from said defined volume location to a different volume location.

2. A magnet assembly as claimed in claim 1 wherein said auxiliary means are disposed on said magnet.

3. A magnet assembly as claimed in claim 1 wherein said auxiliary means are disposed in said magnet.

4. A magnet assembly as claimed in claim 1 wherein said auxiliary means comprises a selected plurality of displacement coils individually chargeable with current for producing a selected spatial displacement of said homogeneity volume.

5. A magnet assembly as claimed in claim 4 wherein said MRI apparatus includes gradient coils and shielding coils for shielding a gradient leakage field from said gradient coils, and wherein said displacement coils are disposed between said gradient coils and said shielding coils.

6. A magnet assembly as claimed in claim 4 wherein said magnetic resonance imaging apparatus includes gradient coils, and wherein said patient receptacle has a surface, and wherein said displacement coils are disposed between said gradient coils and said surface.

7. A magnet assembly as claimed in claim 4 wherein said magnet has a periphery with a peripheral direction, and wherein said displacement coils are rotatable in said peripheral direction.

8. A magnet assembly as claimed in claim 1 wherein said auxiliary means comprise a selected plurality of ferromagnetic displacement elements which are individually positionable relative to said magnet to produce a selected spatial displacement of said homogeneity volume.

9. A magnet assembly as claimed in claim 8 wherein said magnetic resonance imaging apparatus includes gradient coils and shielding coils for shielding a gradient leakage field produced by said gradient coils, and wherein said magnet has an end face containing an opening of said patient receptacle, and wherein said displacement elements are insertable between said gradient coils and said shielding coils from said end face of said magnet.

10. A magnet assembly as claimed in claim 8 wherein said magnetic resonance imaging apparatus includes gradient coils and wherein said patient receptacle has surface and wherein said magnet has an end face containing an opening of said patient receptacle, and wherein said displacement elements are insertable between said gradient coils and said surface from said end face.

11. A magnet assembly as claimed in claim 8 wherein said magnet has a periphery with a peripheral direction, and wherein said displacement elements are rotatable in said peripheral direction.

* * * * *